(12) United States Patent
Hung et al.

(10) Patent No.: US 7,518,912 B2
(45) Date of Patent: Apr. 14, 2009

(54) MULTI-LEVEL NON-VOLATILE MEMORY

(75) Inventors: Chih-Wei Hung, Hsin-chu (TW); Chih-Chen Chou, Taipei (TW)

(73) Assignee: Powerchip Semiconductor Corp., Hsinchu (TW)

( * ) Notice: Subject to any disclaimer, the term of this patent is extended or adjusted under 35 U.S.C. 154(b) by 319 days.

(21) Appl. No.: 11/467,169

(22) Filed: Aug. 25, 2006

(65) Prior Publication Data

US 2008/0049517 A1    Feb. 28, 2008

(51) Int. Cl.
*G11C 11/34* (2006.01)

(52) U.S. Cl. .................. 365/185.03; 365/185.05; 257/315

(58) Field of Classification Search ............ 365/185.03, 365/185.05; 257/315
See application file for complete search history.

(56) References Cited

U.S. PATENT DOCUMENTS

| | | | |
|---|---|---|---|
| 6,897,517 B2 * | 5/2005 | Van Houdt et al. ......... | 257/315 |
| 7,120,059 B2 * | 10/2006 | Yeh ........................ | 365/185.19 |
| 7,209,386 B2 * | 4/2007 | Yeh ........................ | 365/185.03 |
| 7,232,722 B2 * | 6/2007 | Van Houdt et al. .......... | 438/257 |
| 2005/0180210 A1 * | 8/2005 | Harari et al. ........... | 365/185.03 |

* cited by examiner

*Primary Examiner*—Tuan T. Nguyen
(74) *Attorney, Agent, or Firm*—Jianq Chyun IP Office

(57) ABSTRACT

A multi-level non-volatile memory including a memory cell disposed on a substrate is provided. The memory cell includes a control gate, a charge storage layer, a doped region, a select gate, and an assist gate. The control gate is disposed on the substrate. The charge storage layer is disposed between the control gate and the substrate. The doped region is disposed in the substrate at the first side of the control gate. The select gate is disposed on the sidewall of the first side of the control gate and on the substrate between the control gate and the doped region. The assist gate is disposed on the sidewall of the second side of the control gate. An inversion layer is formed in the substrate below the assist gate when a voltage is applied to the assist gate.

23 Claims, 13 Drawing Sheets

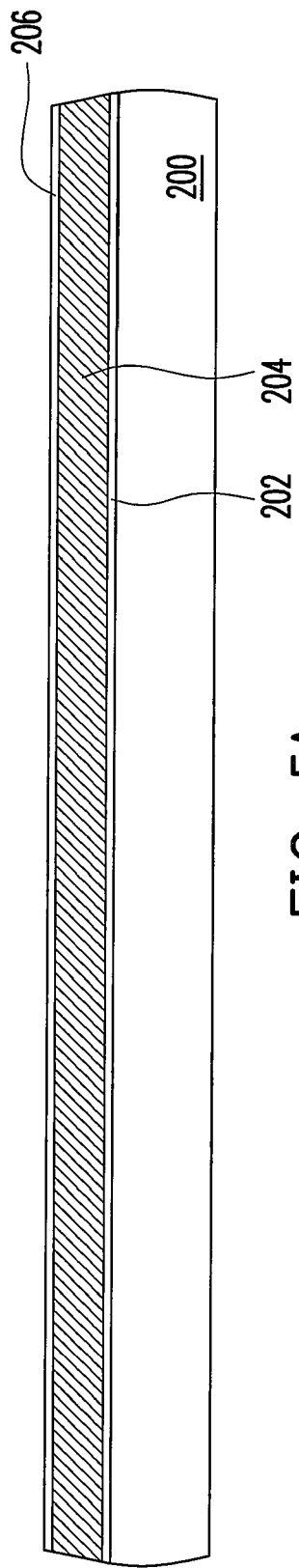
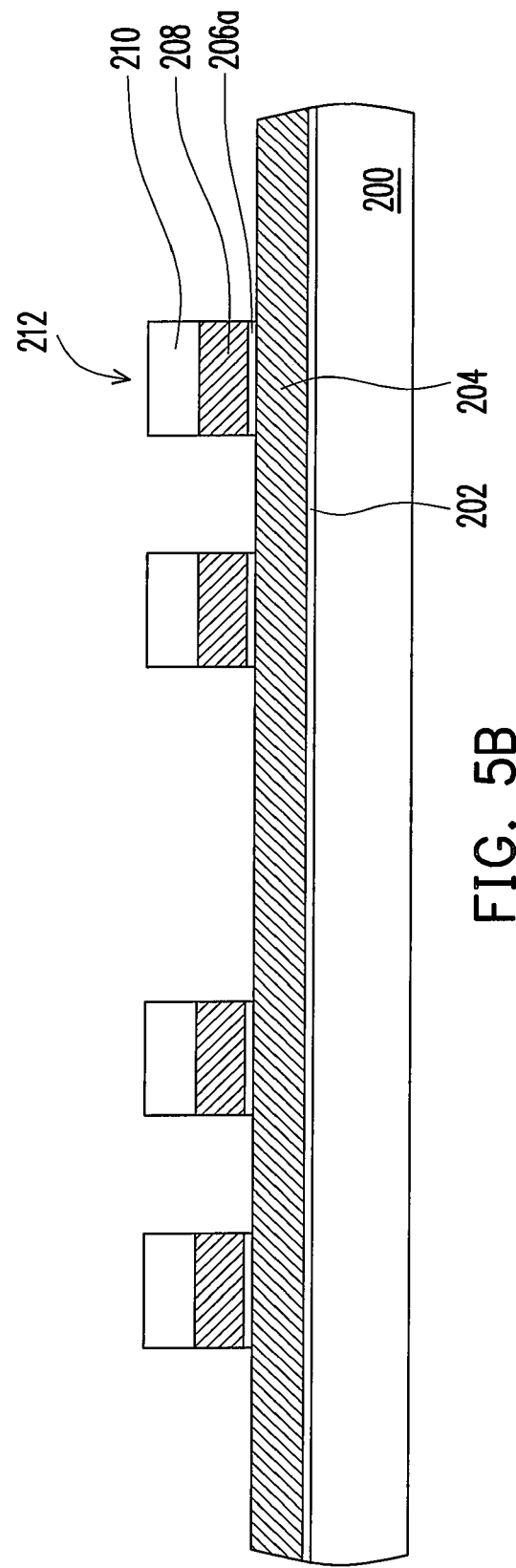

MULTI-LEVEL NON-VOLATILE MEMORY

BACKGROUND OF THE INVENTION

1. Field of the Invention

The present invention relates to a semiconductor device. More particularly, the present invention relates to a multi-level non-volatile memory, a manufacturing method thereof, and an operation method thereof.

2. Description of Related Art

Non-volatile memory device has been widely applied to personal computers and electronic apparatuses for the operations of data writing, reading, and erasing can be performed repeatedly to a non-volatile memory device and the data stored in a non-volatile memory device will not be lost even after power supply is turned off.

The floating gate and control gate of a typical non-volatile memory device are fabricated with doped polysilicon. The control gate is disposed on the floating gate directly, the floating gate and the control gate are isolated by a dielectric layer, and the floating gate and the substrate are isolated by a tunneling oxide (the so-called stacked gate flash memory). Moreover, to resolve the problem of data misjudgment due to over-erase when erasing the memory, a select gate is further disposed on the sidewalls of the control gate and the floating gate, above the substrate to form a split gate structure.

Generally speaking, the commonly-used non-volatile memory device is of, for example, NOR array structure. In a conventional NOR array, every two memory cells share the contact window of a bit line and a source line. Thus, each memory cell takes up the size of half contact window and half source line. In the NOR array, reading and writing operations can be performed randomly to the memory cells since every memory cell is directly connected by a bit line, and the current of a memory cell during reading operation is larger, accordingly the reading speed is faster, since the resistor connected in series is smaller.

However, when a memory in the NOR non-volatile memory device is used as a multi-level memory cell, the threshold voltage for determining various data states has small distribution range, thus, in the programming operation of conventional NOR non-volatile memory, multiple programming steps and programming confirmation steps have to be executed to make the threshold voltage of the programmed memory cell to be within a predetermined distribution range, which may require a long time.

SUMMARY OF THE INVENTION

Accordingly, the present invention is directed to provide a multi-level non-volatile memory, a manufacturing method thereof, and an operation method thereof for improving the reliability of the device.

According to another aspect of the present invention, a multi-level non-volatile memory, a manufacturing method thereof, and an operation method thereof are provided for simplifying the processes and increasing the process window.

According to yet another aspect of the present invention, a multi-level non-volatile memory, a manufacturing method thereof, and an operation method thereof are provided for reducing the programming time and increasing the erasing speed of the memory cells.

The present invention provides a multi-level non-volatile memory including a first memory cell disposed on a substrate. The first memory cell includes a control gate, a charge storage layer, a doped region, a select gate, and an assist gate. The control gate is disposed on the substrate. The charge storage layer is disposed between the control gate and the substrate. The doped region is disposed in the substrate at the first side of the control gate. The select gate is disposed on the sidewall of the first side of the control gate and on the substrate between the control gate and the doped region. The assist gate is disposed on the sidewall of the second side of the control gate. An inversion layer is formed in the substrate below the assist gate when a voltage is applied to the assist gate.

According to an embodiment of the present invention, the multi-level non-volatile memory further includes a first dielectric layer, a second dielectric layer, a third dielectric layer, and a fourth dielectric layer. The first dielectric layer is disposed between the charge storage layer and the substrate. The second dielectric layer is disposed between the charge storage layer and the control gate. The third dielectric layer is disposed between the assist gate and the control gate, the charge storage layer, and between the assist gate and the substrate. The fourth dielectric layer is disposed between the select gate and the control gate, the charge storage layer, and between the select gate and the substrate.

According to an embodiment of the present invention, a spacer is formed between the third dielectric layer and the control gate, the charge storage layer.

According to an embodiment of the present invention, a spacer is formed between the fourth dielectric layer and the control gate.

According to an embodiment of the present invention, the material of the first dielectric layer includes silicon oxide.

According to an embodiment of the present invention, the material of the second dielectric layer includes silicon oxide/silicon nitride/silicon oxide.

According to an embodiment of the present invention, the third dielectric layer and the fourth dielectric layer are high temperature thermal oxide layers.

According to an embodiment of the present invention, the thicknesses of the third dielectric layer and the fourth dielectric layer are between 100 A and 200 A.

According to an embodiment of the present invention, the multi-level non-volatile memory further includes a second memory cell. The second memory cell has the same structure as the first memory cell and is disposed adjacently with the first memory cell in mirror symmetry.

According to an embodiment of the present invention, the second memory cell is disposed at the first side of the first memory cell and shares the same doped region with the first memory cell.

According to an embodiment of the present invention, the second memory cell is disposed at the second side of the first memory cell and shares the same assist gate with the first memory cell.

According to an embodiment of the present invention, the multi-level non-volatile memory further includes a cap layer disposed on the control gate.

According to an exemplary embodiment of the present invention, the charge storage layer is protruded from the control gate horizontally and has a corner at where adjacent to the select gate.

The present invention provides a multi-level non-volatile memory including a plurality of memory cells, a plurality of bit lines, a plurality of control gate lines, a plurality of select gate lines, a plurality of assist gate lines, and a plurality of transistors. The memory cells are disposed on the substrate in an array. Each memory cell includes a control gate, a charge storage layer, a doped region, a select gate, and an assist gate. The control gate is disposed on the substrate. The charge storage layer is disposed between the control gate and the substrate. The doped region is disposed in the substrate at the first side of the control gate. The select gate is disposed on the sidewall of the first side of the control gate and on the substrate between the control gate and the doped region. The assist gate is disposed on the sidewall of the second side of the control gate, wherein the memory cells in the same row are disposed adjacently in mirror symmetry. The bit lines are arranged in parallel in the direction of a row and connect the doped regions of the memory cells in the same row. The control gate lines are arranged in parallel in the direction of a column and connect the control gates of the memory cells in the same column. The select gate lines are arranged in parallel in the direction of a column and connect the select gates of the memory cells in the same column. The assist gate lines are arranged in parallel in the direction of a column and connect the assist gate of the memory cells in the same column. The drains of the transistors are respectively connected to the substrate below the assist gate lines.

According to an embodiment of the present invention, the multi-level non-volatile memory further includes a first dielectric layer, a second dielectric layer, a third dielectric layer, and a fourth dielectric layer. The first dielectric layer is disposed between the charge storage layer and the substrate. The second dielectric layer is disposed between the charge storage layer and the control gate. The third dielectric layer is disposed between the assist gate and the control gate, the charge storage layer, and between the assist gate and the substrate. The fourth dielectric layer is disposed between the select gate and the control gate, the charge storage layer, and between the select gate and the substrate.

According to an embodiment of the present invention, a spacer is formed between the third dielectric layer and the control gate, the charge storage layer.

According to an embodiment of the present invention, a spacer is formed between the fourth dielectric layer and the control gate.

According to an exemplary embodiment of the present invention, the material of the first dielectric layer includes silicon oxide.

According to an embodiment of the present invention, the material of the second dielectric layer includes silicon oxide/silicon nitride/silicon oxide.

According to an embodiment of the present invention, the third dielectric layer and the fourth dielectric layer are high temperature thermal oxide layers.

According to an embodiment of the present invention, the charge storage layer is protruded from the control gate horizontally and has a corner at where adjacent to the select gate.

According to an embodiment of the present invention, the two adjacent memory cells disposed in mirror symmetry share the same drain region.

According to an embodiment of the present invention, the two adjacent memory cells disposed in mirror symmetry share the same assist gate.

According to an embodiment of the present invention, the adjacent two memory cells are disposed, for example, in mirror symmetry, that is, the adjacent two memory cells share the same assist gate or the same doped region. Thus, the structure of the multi-level non-volatile memory in the present invention can simplify the manufacturing process, reduce the manufacturing cost, and increase the integration of the device.

Moreover, when a voltage is applied to the assist gate to open the channel below the assist gate and to form the inversion layer, a voltage is applied to the inversion layer so that the inversion layer below the assist gate is in a pre-charged state. When programming the non-volatile memory in the present invention, the memory cell is programmed by using source side injection effect through channel self-boosting so that the programming speed can be increased. Besides, when the non-volatile memory is used as a multi-level memory cell, the threshold voltage of the programmed memory cell can be accurately controlled during the programming operation to be within the predetermined range.

The present invention provides a manufacturing method of multi-level non-volatile memory, the method includes following steps. First, a tunneling dielectric layer and a charge storage layer are formed in sequence on the substrate, and at least two stacked layers are formed on the charge storage layer, wherein every two stacked layers include an inter-gate dielectric layer, a control gate, and a cap layer in sequence. Next, the charge storage layer between the two stacked layers is removed to form a first trench. After the spacers are formed on the sidewalls of the two stacked layers and the first trench, the charge storage layer outside of the two stacked layers is removed with the spacer as a mask. Then, a dielectric layer is formed on the substrate. An assist gate is formed between the two stacked layers and a select gate is respectively formed on the sidewalls outside the two stacked layers. After that, a doped region is respectively formed in the substrate outside of the two stacked layers, and the select gates are located between the stacked layers and the doped regions.

According to an embodiment of the present invention, the dielectric layer includes high temperature thermal oxide layer.

According to an embodiment of the present invention, the thickness of the dielectric layer is between 100 A and 200 A.

According to an embodiment of the present invention, an assist gate is formed between two stacked layers, and the method for forming a select gate respectively on the sidewall outside the two stacked layers is described as follows. First, a conductive material layer filling up the first trench is formed on the substrate, and then an etch back process is performed to remove part of the conductive material layer until the cap layer is exposed.

According to an embodiment of the present invention, the material of the tunneling dielectric layer includes silicon oxide.

According to an embodiment of the present invention, the method for forming the tunneling dielectric layer includes thermal oxidation.

According to an embodiment of the present invention, the material of the inter-gate dielectric layer includes silicon oxide/silicon nitride/silicon oxide.

According to an embodiment of the present invention, the material of the charge storage layer includes doped polysilicon.

According to an embodiment of the present invention, self-alignment is adopted to form the assist gate and the select gate, thus, no photolithography process is required so that the manufacturing cost can be reduced and the process window can be increased.

Moreover, the charge storage layer has a corner adjacent to the select gate, thus, when erasing the memory cell, the electric field is concentrated at the corner so that the speed pulling electrons from the charge storage layer to the select gate during the erasing operation can be increased.

The present invention provides an operation method of multi-level non-volatile memory suitable for a memory cell. The memory cell includes a control gate, a charge storage layer, a drain region, a select gate, and an assist gate. The control gate is disposed on the substrate. The charge storage layer is disposed between the control gate and the substrate. The drain region is disposed in the substrate at the first side of the control gate. The select gate is disposed on the sidewall of the first side of the control gate and on the substrate between the control gate and the doped region. The assist gate is disposed on the sidewall of the second side of the control gate. The operation method includes following steps while performing programming operation. A first voltage is applied to the assist gate to form an inversion layer in the substrate below the assist gate and a second voltage is applied to the inversion layer. Then, a third voltage is applied to the control gate, a fourth voltage is applied to the select gate, a fifth voltage is applied to the drain region, wherein the first voltage is greater than the threshold voltage of the assist gate, the third voltage is greater than the first voltage, the fourth voltage is greater than or equal to the threshold voltage of the select gate, the second voltage is greater than the fifth voltage, so as to program the memory cell by using source side injection effect.

According to an embodiment of the present invention, the first voltage is about 8V, the second voltage is about 5V, the third voltage is about 10V, the fourth voltage is about 1.5V, and the fifth voltage is about 0V.

According to an embodiment of the present invention, the operation method of a multi-level non-volatile memory further includes following steps while performing erasing operation. A sixth voltage is applied to the select gate to pull out and remove the electrons stored in the charge storage layer through the select gate, wherein the voltage difference between the select gate and the substrate may induce FN tunneling effect.

According to an embodiment of the present invention, the sixth voltage is about 11V~15V.

According to an embodiment of the present invention, the operation method of a multi-level non-volatile memory further includes following steps while performing reading operation. A seventh voltage is applied to the assist gate, an eighth voltage is applied to the control gate, a ninth voltage is applied to the select gate, and a tenth voltage is applied to the drain region, so as to read the memory cell, the ninth voltage is greater than the threshold voltage of the select gate.

According to an embodiment of the present invention, the seventh voltage is Vcc (power supply voltage), the eighth voltage is about 1.4V, the ninth voltage is Vcc (power supply voltage), and the tenth voltage is about 1.5V.

The present invention provides an operation method of a multi-level non-volatile memory, and the operation method is suitable for a memory cell array composed of a plurality of memory cells. Each memory cell includes a control gate, a charge storage layer, a doped region, a select gate, and an assist gate. The control gate is disposed on the substrate. The charge storage layer is disposed between the control gate and the substrate. The doped region is disposed in the substrate at the first side of the control gate. The select gate is disposed on the sidewall of the first side of the control gate and on the substrate between the control gate and the doped region. The assist gate is disposed on the sidewall of the second side of the control gate, wherein the memory cells in the same row are disposed adjacently in mirror symmetry. A plurality of bit lines are arranged in parallel in the direction of a row and connect the doped regions of the memory cells in the same row. A plurality of control gate lines are arranged in parallel in the direction of a column and connect the control gates of the memory cells in the same column. A plurality of select gate lines are arranged in parallel in the direction of a column and connect the select gates of the memory cells in the same column. A plurality of assist gate lines are arranged in parallel in the direction of a column and connect the assist gates of the memory cells in the same column. The drains of the transistors are connected to the substrate below the assist gate lines. The operation method includes following steps while performing programming operation. First, a first voltage is applied to the gates of the transistors, a second voltage is applied to the sources of the transistors, a third voltage is applied to the assist gate lines, so as to form an inversion layer in the substrate below the assist gate lines and the inversion layer is turned on with a second voltage, then the gate voltage of the transistors are changed to 0V to switch off the channels of the transistors, so that the inversion layer is in a pre-charged state, then the assist gate voltage is pulled up to about 8V to couple the voltage of the inversion layer to about 5V. A fourth voltage is applied to the selected control gate line, a fifth voltage is applied to the selected select gate line, a sixth voltage is applied to the selected bit line, wherein the third voltage is greater than the threshold voltage of the assist gate, the fourth voltage is greater than the third voltage, the fifth voltage is greater than or equal to the threshold voltage of the select gate, the second voltage is greater than the sixth voltage, so as to program the selected memory cell by using source side injection effect.

According to an embodiment of the present invention, the first voltage is Vcc (power supply voltage), the second voltage is Vcc (power supply voltage)-Vth (the threshold voltage of the transistor), the third voltage is Vcc (power supply voltage), the fourth voltage is about 10V, the fifth voltage is about 1.5V, and the sixth voltage is about 0V.

According to an embodiment of the present invention, the operation method of a multi-level non-volatile memory further includes following steps while performing erasing operation. A seventh voltage is applied to the select gate, so as to pull out and remove the electrons stored in the charge storage layer through the select gate lines, wherein the voltage difference between the select gate and the substrate may induce FN tunneling effect.

According to an embodiment of the present invention, the seventh voltage is about 11V~15V.

According to an embodiment of the present invention, the operation method of a multi-level non-volatile memory further includes following steps while performing reading operation. An eighth voltage is applied to the selected assist gate line, a ninth voltage is applied to the selected control gate line, a tenth voltage is applied to the selected select gate line, and an eleventh voltage is applied to the selected bit line, so as to read memory cell, wherein the tenth voltage is greater than the threshold voltage of the select gate.

According to an embodiment of the present invention, the eighth voltage is Vcc (power supply voltage), the ninth voltage is about 1.4V, the tenth voltage is Vcc (power supply voltage), and the eleventh voltage is about 1.5V.

In the present embodiment of the present invention, the memory cell is programmed by using source side injection through channel self-boosting, thus, the channel of the assist gate is charged to a predetermined voltage in advance, so that the memory cell can be programmed quickly. Besides, the memory cell is erased by using the select gate, so that the electrons are removed through the erasing gate, so that the number of times of the electrons passing through the tunneling dielectric layer is reduced and the reliability of the device is increased. Moreover, the charge storage layer has a corner adjacent to the select gate. While performing erasing operation, the electric field is concentrated through the corner, so that the speed of pulling the electrons from the charge storage layer to the select gate during the erasing operation is increased.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 5A~5G are cross-sectional views illustrating the manufacturing flow of a non-volatile memory according to an embodiment of the present invention.

DESCRIPTION OF EMBODIMENTS

Figure 1:
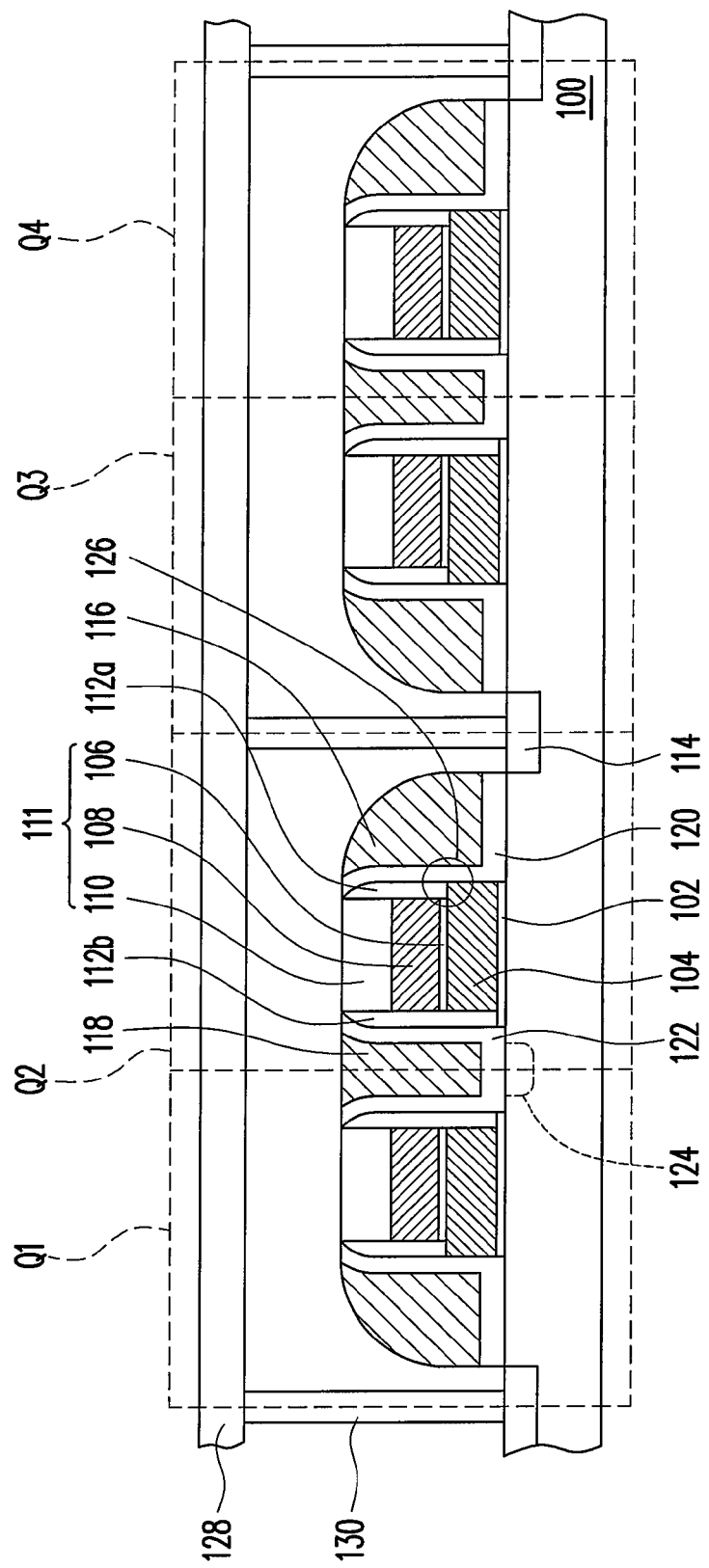
FIG. 1 is a cross-sectional view of a non-volatile memory according to an embodiment of the present invention.

FIG. 1 is a cross-sectional view of a non-volatile memory according to an embodiment of the present invention.

Referring to FIG. 1, the multi-level non-volatile memory provided by the present invention includes, for example, a plurality of memory cells Q1, Q2, Q3, and Q4 disposed on the substrate 100. Each of the memory cells Q1, Q2, Q3, and Q4 includes a tunneling dielectric layer 102, a charge storage layer 104, an inter-gate dielectric layer 106, a control gate 108, a cap layer 110, spacers 112a, 112b, a doped region 114, a select gate 116, an assist gate 118, and dielectric layers 120, 122. The inter-gate dielectric layer 106, the control gate 108, and the cap layer 110 form a stacked layer 111.

The control gate 108 is, for example, disposed on the substrate 100. The material of the control gate 108 is, for example, doped polysilicon.

The charge storage layer 104 is, for example, disposed between the control gate 108 and the substrate 100. The material of the charge storage layer 104 is, for example, conductive material (such as doped polysilicon) or other charge-trapping material such as $Si_3N_4$, SiON, TaO, $SrTiO_3$, or HfO.

The inter-gate dielectric layer 106 is, for example, disposed between the control gate 108 and the charge storage layer 104, and the material of the inter-gate dielectric layer 106 is, for example, silicon oxide/silicon nitride/silicon oxide.

The tunneling dielectric layer 102 is, for example, disposed on the substrate 100 below the charge storage layer 104, and the material of the tunneling dielectric layer 102 is, for example, silicon oxide.

The doped region 114 is disposed in the substrate 100 at one side of the control gate 108, and the doped region 114 is used as, for example, the drain region.

The select gate 116 is, for example, disposed on the sidewall of one side of the control gate 108 and on the substrate 100 between the control gate 108 and the doped region 114. The material of the select gate 116 is, for example, doped polysilicon.

The dielectric layer 120 is, for example, disposed between the select gate 116 and the control gate 108, the charge storage layer 104, and between the select gate 116 and the substrate 100. The material of the dielectric layer 120 is, for example, silicon oxide formed by thermal oxidation process. The thickness of the dielectric layer 120 is about 100 angstrom (Å) to 200 angstrom (Å). The portion of the dielectric layer 120 between the select gate 116 and the substrate 100 is used as the select gate dielectric layer.

The assist gate 118 is disposed on the sidewall of the other side of the control gate 108, and an inversion layer 124 is formed in the substrate 100 below the assist gate 118 when a voltage is applied to the assist gate 118. The material of the assist gate 118 is, for example, doped polysilicon.

The dielectric layer 122 is, for example, disposed between the assist gate 118 and the control gate 108, the charge storage layer 104, and between the assist gate 118 and the substrate 100. The material of the dielectric layer 122 is, for example, silicon oxide formed with thermal oxidation. The portion of the dielectric layer 122 between the assist gate 118 and the substrate 100 is used as the assist gate dielectric layer. The thickness of the dielectric layer 122 is about 100 angstrom (Å) to 200 angstrom (Å).

A spacer 112b is, for example, disposed between the assist gate 118 and the control gate 108, the charge storage layer 104. A spacer 112a is, for example, disposed between the select gate 116 and the control gate 108. The material of the spacers 112a and 112b is, for example, silicon nitride. The charge storage layer 104 is protruded from the control gate 108 horizontally and is located below the spacer 112a so that the charge storage layer 104 has a corner 126 adjacent to the select gate 116, thus, when erasing the memory cell, the electric field is concentrated by the corner 126, so that the pulling of the electrons from the charge storage layer 104 to the select gate 116 during the erasing operation is increased.

Besides, the doped region 114 is, for example, electrically connected to the bit line 128 through the plug 130. The material of the plug 130 and the bit line 128 is, for example, conductive material.

In an embodiment of the present invention, two adjacent memory cells are, for example, disposed in a mirror symmetry manner, that is, two adjacent memory cells share the assist gate or the doped region. For example, the memory cell Q1 and the memory cell Q2 share the assist gate; the memory cell Q2 and the memory cell Q3 share the doped region; the memory cell Q3 and the memory cell Q4 share the assist gate. Thus, the structure of the multi-level non-volatile memory in the present invention can simplify the manufacturing flow, reduce the manufacturing cost, and meanwhile increase the integration of the device.

Moreover, while a voltage is applied to the assist gate 118 to open up the channel below the assist gate 118 and to form the inversion layer 124, a voltage is applied to the inversion layer 124 to make the inversion layer 124 below the assist gate 118 to be in pre-charged state. While programming the non-volatile memory in the present invention, memory cell is programmed through channel self-boosting with source side injection, so as to increase the speed of programming. Furthermore, while the non-volatile memory is used as a multi-level memory cell, so that the threshold voltage of the programmed memory cell can be accurately controlled when programming the memory cell to be within a predetermined range.

For example, the multi-level memory cell determines four different threshold voltages Vth1, Vth2, Vth3, Vth4 according to the basic read voltages Vref1, Vref2, Vref3, wherein Vth1<Vref1<Vth2<Vref2<Vth3<Vref3<Vth4. Vth1 is, for example, smaller than 0V and is denoted as "00" status, Vref1 is, for example, about 0V, Vth2 is, for example, between 0.2V and 2V and is denoted as "01" status, Vref2 is, for example, 2.2V, Vth3 is, for example, between 2.4V and 4.2V and is denoted as "10" status, Vref3 is, for example, 4.4V, Vth4 is, for example, greater than 4.4V and is denoted as "11" status. While performing programming operation, the threshold voltage of the memory cell has to fall accurately into the range of 0.2V~2V or 2.4V~4.2V to allow the memory cell to be in "01" or "10" status. Many programming steps and programming confirmation steps have to be performed to allow the programmed memory cell to be accurate at the predetermined threshold voltage, accordingly long time is required. However, if the memory cell is programmed by using source side injection effect through channel self-boosting to charge the channel of the assist gate to the predetermined voltage in advance, the memory cell can be programmed to "01" or "10" status quickly. As to "11" status, the memory cell can be programmed with or without channel self-boosting.

Figure 2A:
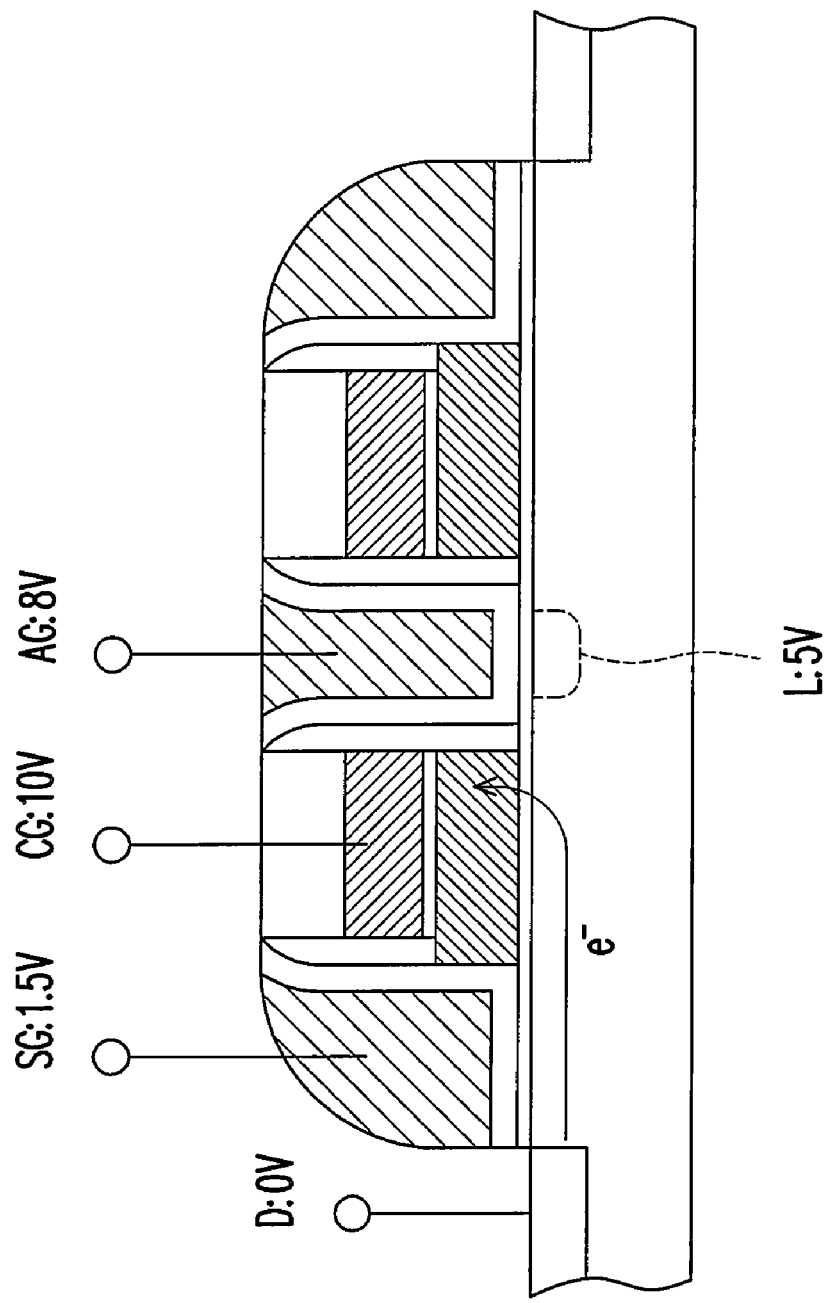
FIG. 2A is a diagram illustrating a programming operation performed to a memory cell.
Figure 2B:
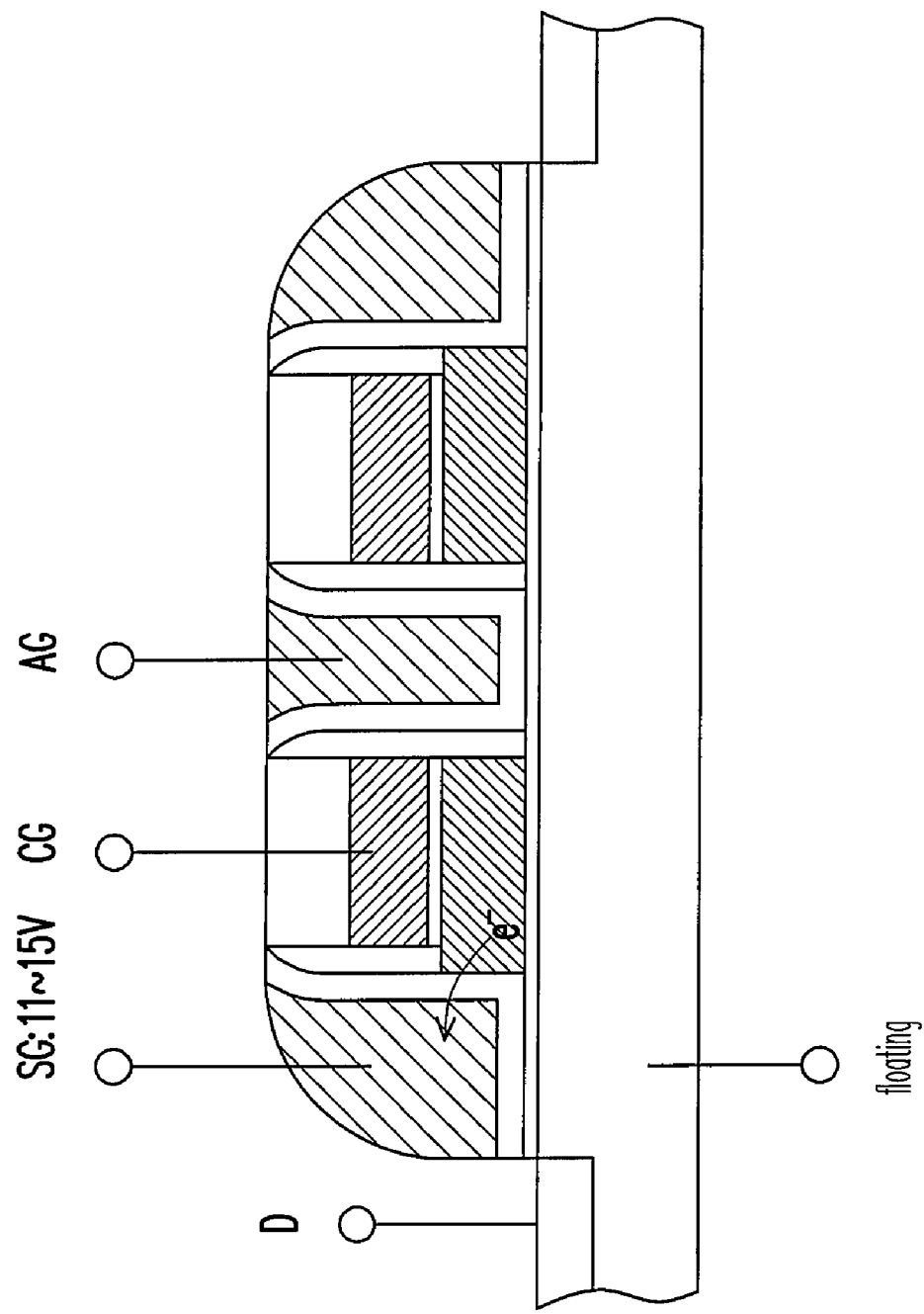
FIG. 2B is a diagram illustrating an erasing operation performed to a memory cell.
Figure 2C:
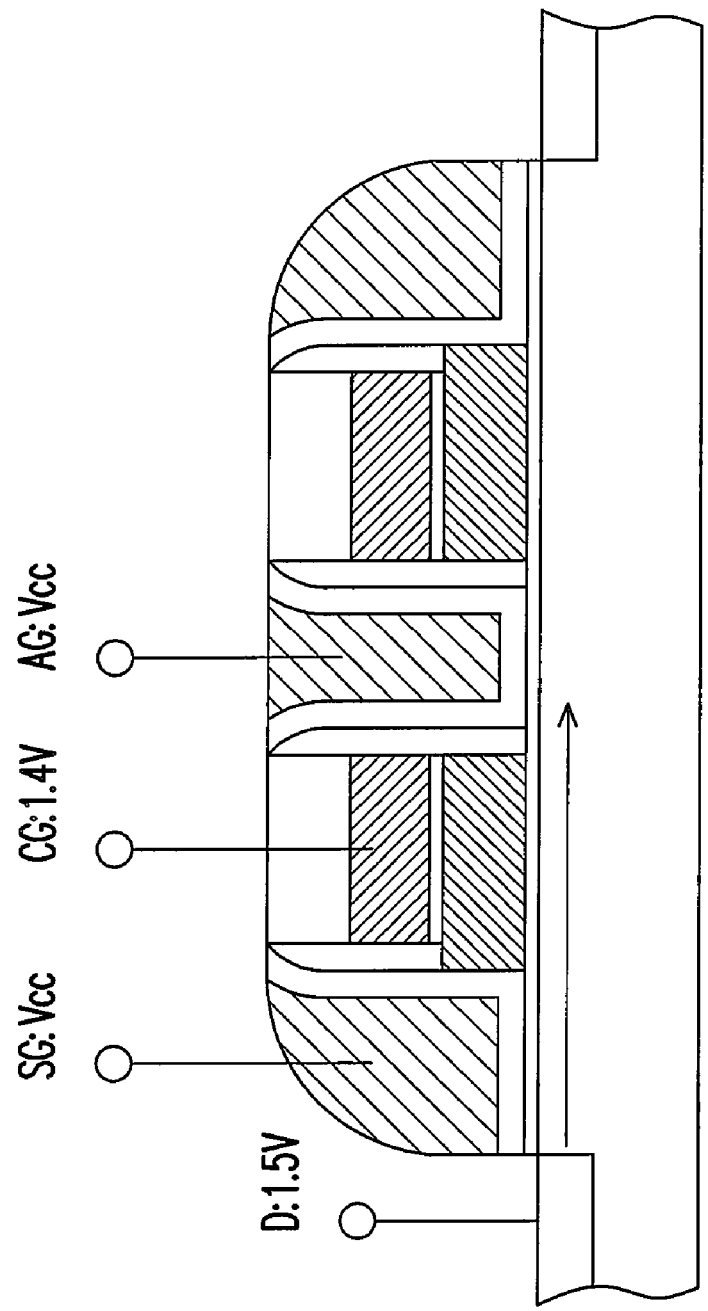
FIG. 2C is a diagram illustrating a reading operation performed to a memory cell.

Next, the operation method of the multi-level non-volatile memory cell in the present invention will be described, which includes operation modes such as programming, erasing, and reading. FIG. 2A is a diagram illustrating a programming operation performed to a memory cell. FIG. 2B is a diagram illustrating an erasing operation performed to a memory cell. FIG. 2C is a diagram illustrating a reading operation performed to a memory cell.

Referring to FIG. 2A, while performing programming operation, a voltage Vag is applied to the assist gate in advance to form an inversion layer L in the substrate below the assist gate AG, and a voltage V1 is applied to the inversion layer L. Wherein the voltage Vag is greater than the threshold voltage of the assist gate AG, the voltage Vag is, for example, about 8V, and the voltage V1 is, for example, 5V.

Then, a voltage Vp1 is applied to the control gate CG, a voltage Vp2 is applied to the select gate SG, and a voltage Vp3 is applied to the drain region D. The voltage Vp1 is greater than the voltage Vag, the voltage Vp1 is, for example, about 10V; the voltage Vp2 is greater than or equal to the threshold voltage of the select gate SG, the voltage Vp2 is, for example, about 1.5V; the voltage V1 is greater than the voltage Vp3, the voltage Vp3 is, for example, about 0V, to program the memory cell by using source side injection effect.

Referring to FIG. 2B, while performing erasing operation, a voltage Ve1 is applied to the select gate SG, and the substrate is floating to pull out and remove the electrons stored in the charge storage layer through the select gate SG, wherein the voltage difference between the select gate SG and the substrate may induce FN tunneling effect. The voltage Ve1 is, for example, about 11V~15V.

Referring to FIG. 2C, while performing reading operation, a voltage Vr1 is applied to the assist gate AG, a voltage Vr2 is applied to the control gate CG, a voltage Vr3 is applied to the select gate SG, a voltage Vr4 is applied to the drain region D, to read the memory cell. Wherein, the voltage Vr1 is determined by, for example, the resistance of the substrate below the assist gate, the voltage Vr1 is, for example, Vcc (power supply voltage). The voltage Vr2 is, for example, about 1.4V. The voltage Vr3 is greater than the threshold voltage of the select gate, the voltage Vr3 is, for example, Vcc (power supply voltage). The voltage Vr4 is, for example, about 1.5V.

Under the bias condition described above, the digital information stored in the memory cell can be determined by detecting the current in the channel of the memory cell.

In the operation method of the present invention, the memory cell is programmed by using source side injection effect through channel self-boosting-charge injection to charge the channel of the assist gate to a predetermined voltage in advance, so as to program the memory cell quickly. Moreover, the memory cell is erased by using the select gate to remove the electrons through the select gate, so that the number of times of the electrons passing through the tunneling dielectric layer is reduced and the reliability of the device is increased. In addition, the charge storage layer has a corner at where adjacent to the select gate, so that while performing erasing operation, the electric field is concentration by the corner, so that the speed of pulling the electrons from the charge storage layer to the select gate during the erasing operation can be increased.

Figure 3:
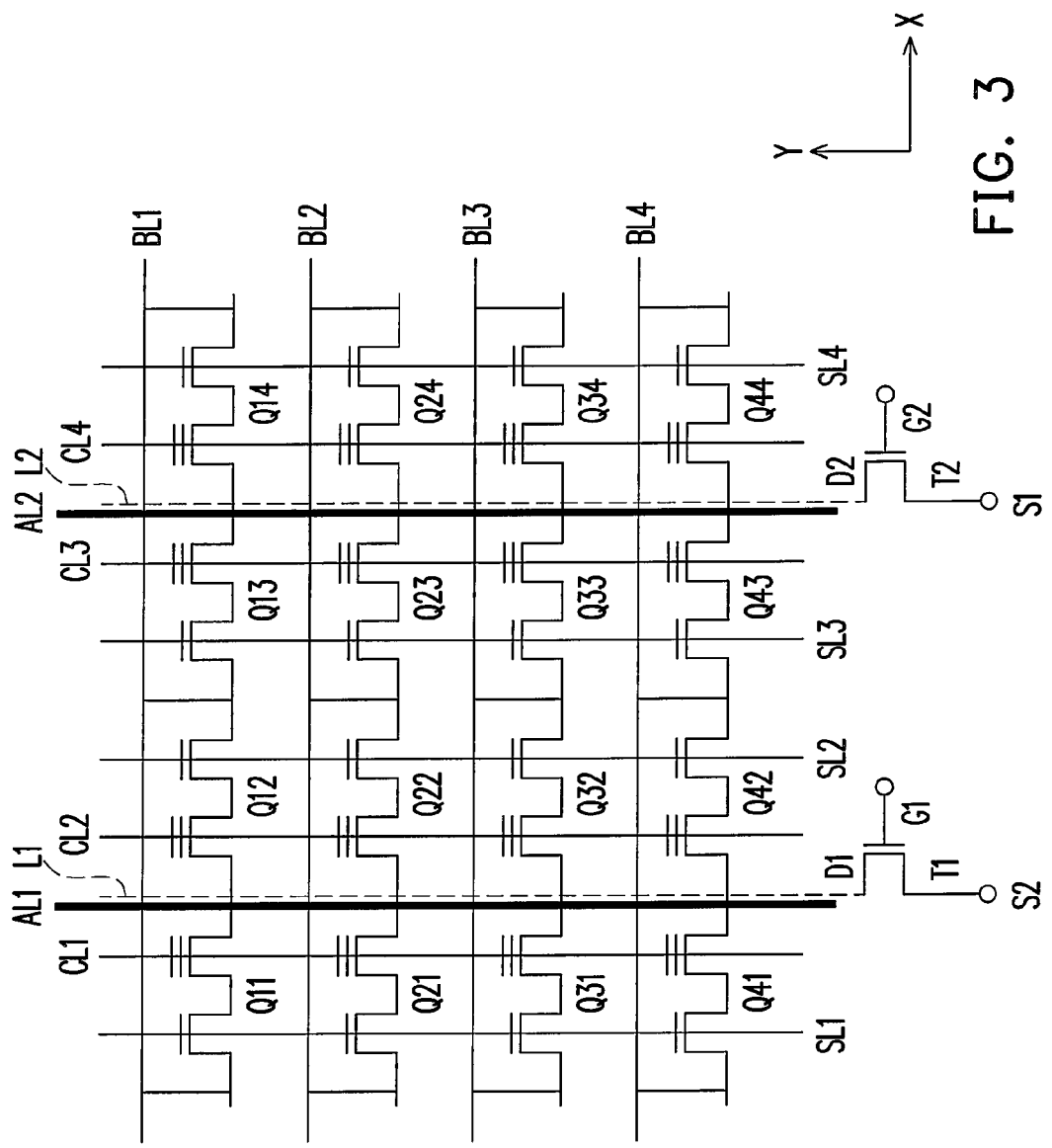
FIG. 3 is a simplified circuit diagram of a memory cell array composed of the multi-level non-volatile memory cells according to an embodiment of the present invention.

FIG. 3 is a simplified circuit diagram of a memory cell array composed of the multi-level non-volatile memory cells according to an embodiment of the present invention.

As shown in FIG. 3, the memory cell array is composed of, for example, memory cells Q11~Q44, a plurality of assist gate lines AL1~AL2, a plurality of bit lines BL1~BL4, and a plurality of control gate lines CL1~CL4. The structure of the memory cells Q11~Q44 is as the structure of Q1~Q4 shown in FIG. 1.

The memory cells Q11~Q44 are arranged into an array. In direction X(the direction of a row), the memory cells Q11~Q14 are, for example, disposed in mirror symmetry. Two adjacent memory cells in Q11~Q14 share an assist gate or a drain region. For example, the memory cells Q11 and Q12 share the assist gate, memory cells Q12 and Q13 share the drain region, and the memory cells Q13 and Q14 share the assist gate.

The assist gate lines AL1~AL2 are arranged in parallel in direction Y (the direction of a column), and connect the assist gates of the memory cells in the same column. For example, the assist gate line AL1 connects the assist gates of the memory cells Q11~Q41 and the memory cells Q12~Q42, and the assist gate line AL2 connects the assist gates of the memory cells Q13~Q43 and the memory cells Q14~Q44.

The bit lines BL1~BL4 are arranged in parallel in direction X (the direction of a row), and connect the drain regions of the memory cells in the same row. For example, the bit line BL1 connects the drain regions of the memory cells Q11~Q44, the bit line BL2 connects the drain regions of the memory cells Q21~Q24, . . . , the bit line BL4 connects the drain regions of the memory cells Q41~Q44.

The control gate lines CL1~CL6 are arranged in parallel in the direction of a column and connect the control gates of the memory cells in the same column. For example, the control gate line CL1 connects the control gates of the memory cells Q11~Q41, the control gate line CL2 connects the control gates of the memory cells Q12~Q42, . . . , the control gate line CL4 connects the control gates of the memory cells Q14~Q44.

The select gate lines SL1~SL4 are arranged in parallel in the direction of a column and connects the select gates of the memory cells in the same column. For example, the select gate line SL1 connects the select gates of memory cells Q11~Q41, the select gate line SL2 connects the select gates of the memory cells Q12~Q42, the select gate line SL4 connects the select gates of the memory cells Q14~Q44.

The drains D1, D2 of the transistors T1, T2 are connected to the substrate below the assist gate lines AL1~AL2. When a voltage is applied to the assist gate lines AL1, AL2 to open the channels below the assist gate lines AL1, AL2 and to form the inversion layer, and a voltage is applied to the gates G1, G2 of the transistors T1, T2 to open the channels of the transistors T1, T2, the currents applied to the sources S1, S2 of the transistors T1, T2 flow to the inversion layer below the assist gate lines AL1, AL2 through the drains D1, D2. Then, the channels of the transistors T1, T2 are turned off and the voltage of the assist gate lines AL1, AL2 are pulled up, so that the inversion layer below the assist gate lines AL1, AL2 can be in a pre-charged state, that is, the voltage of the inversion layer is greater than the voltage of the sources S1, S2 minus the threshold voltage of the transistors T1, T2. While programming the non-volatile memory in the present invention, the programming speed can be increased by using channel self-boosting. Besides, while the non-volatile memory is used as a multi-level memory cell, the threshold voltage of the programmed memory cell can be controlled to fall accurately within the predetermined range when performing programming operation.

Figure 4A:
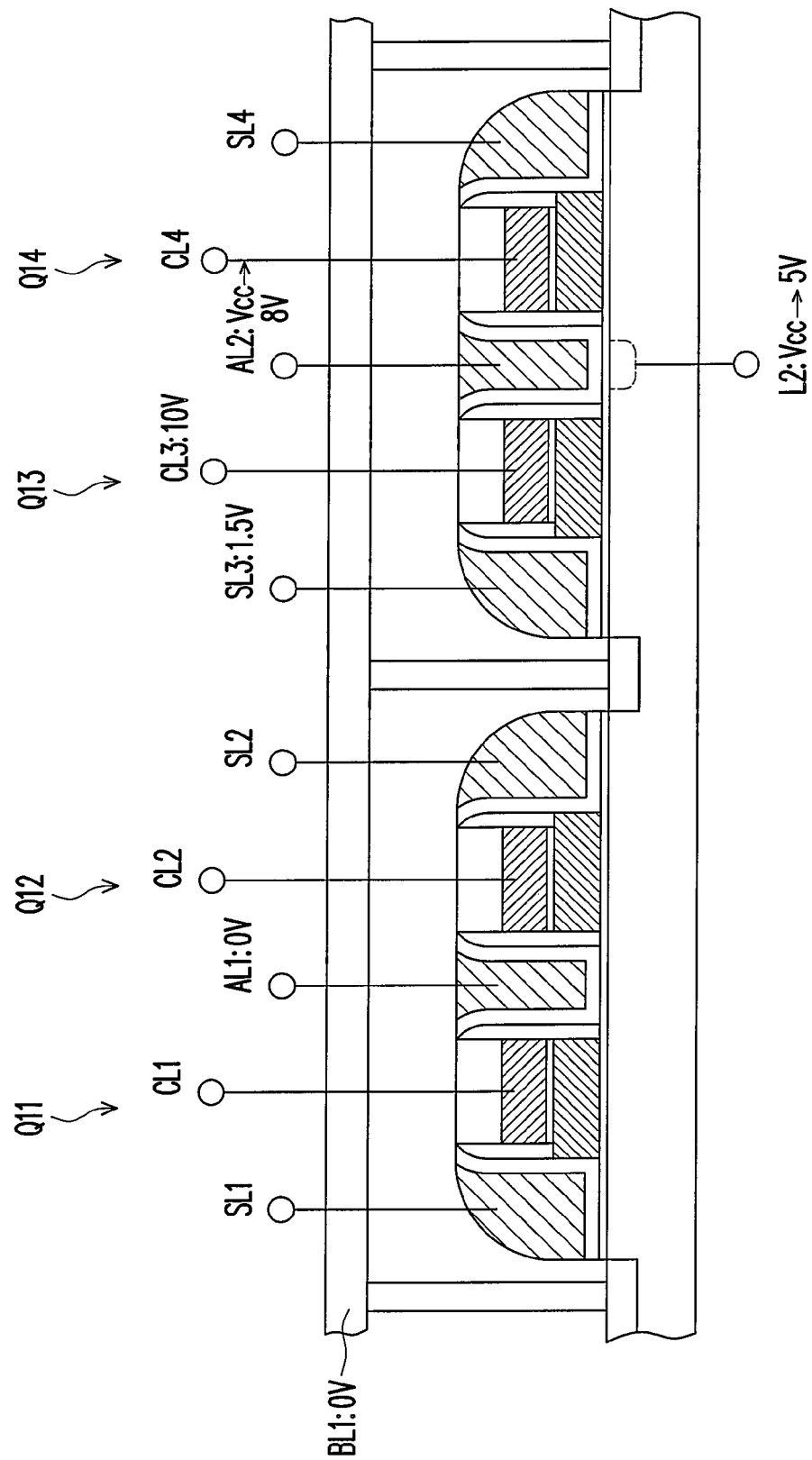
FIG. 4A is a diagram illustrating a programming operation performed to a memory array.
Figure 4B:
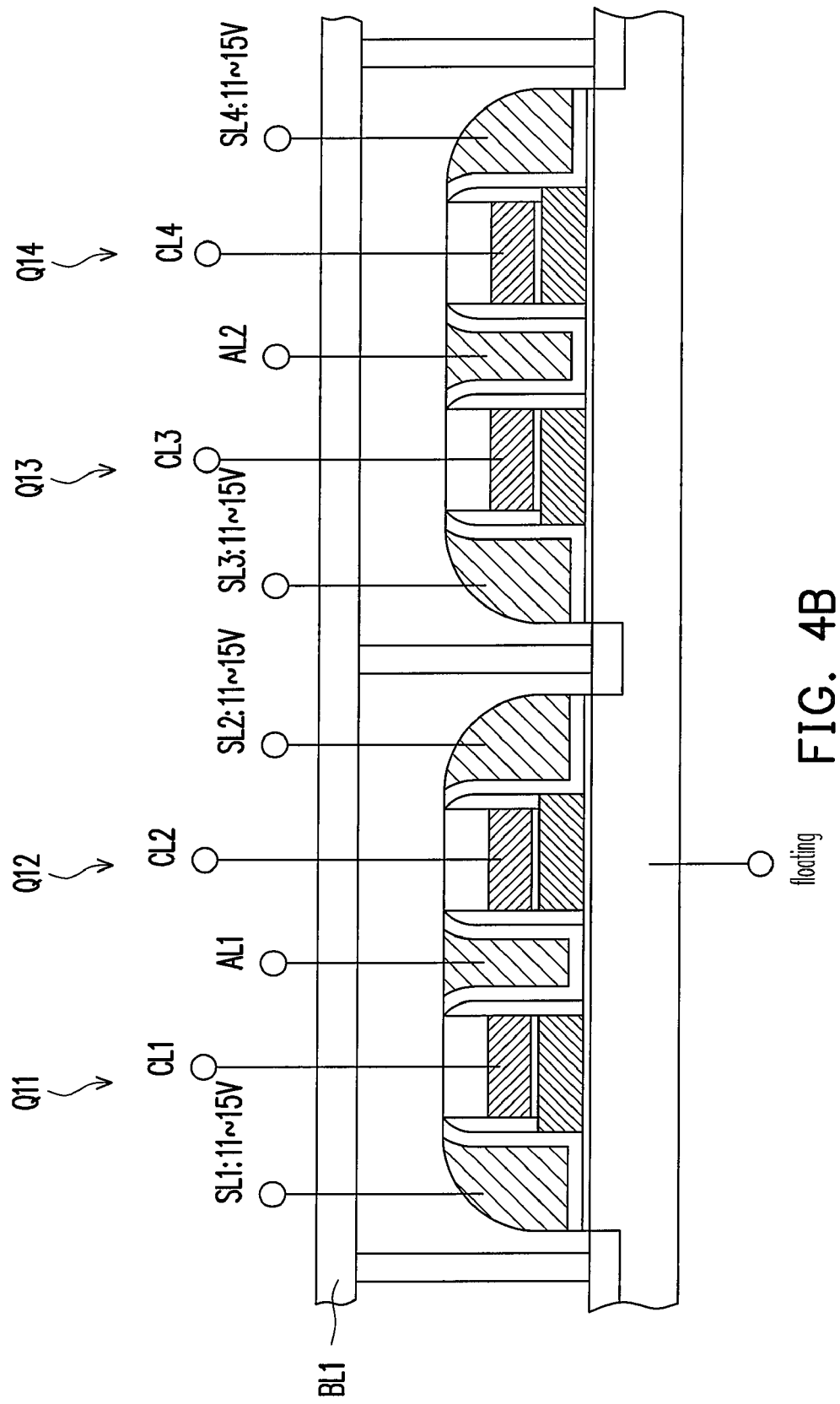
FIG. 4B is a diagram illustrating an erasing operation performed to a memory array.
Figure 4C:
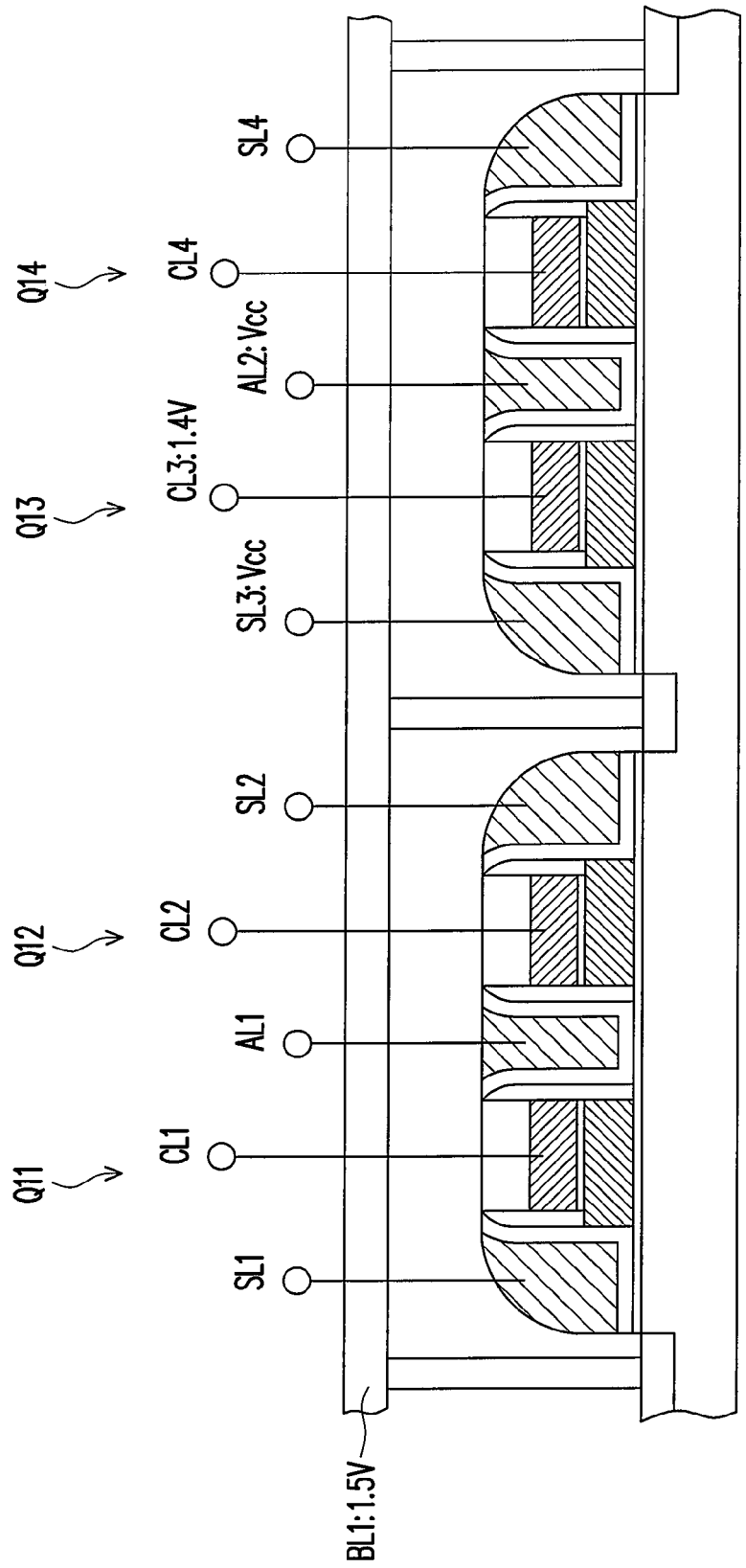
FIG. 4C is a diagram illustrating a reading operation performed to a memory array.

Next, the operation method including operation modes such as programming, erasing, and data reading of the non-volatile memory array in the present invention will be described. Only one exemplary embodiment will be explained as an example of the operation method of the non-volatile memory in the present invention. However, the operation method of the non-volatile memory array in the present invention is not limited to such method. Wherein, FIG. 4A is a diagram illustrating a programming operation performed to a memory array. FIG. 4B is a diagram illustrating an erasing operation performed to a memory array. FIG. 4C is a diagram illustrating a reading operation performed to a memory array. Besides, the memory unit Q13 in FIG. 3 is used as an example in following description.

Referring to FIG. 3 and FIG. 4A, while programming the memory cell Q13, a voltage Vtg is applied to the gates of the transistors T1, T2 in advance; a voltage Vts is applied to the sources S1, S2 of the transistors T1, T2; a voltage Va1 is applied to the assist gate line AL2 to form an inversion layer L2 in the substrate below the assist gate line AL2 and, the inversion layer L2 is conducted with voltage Vts-Vth, wherein Vth is the threshold voltage of the transistors T1, T2. The voltage of the assist gate line AL1 is maintained at 0V, thus, an inversion layer will not be formed in the substrate below. Then, the channels of the transistors T1 and T2 are turned off, and the voltage of the assist gate line AL2 is pulled to about 8V to couple the voltage of the inversion layer L2 to about 5V, so that the inversion layer L2 can be in a pre-charged state. Wherein, the voltage Vtg is, for example, greater than or equal to the threshold voltage Vth of the transistors T1, T2 so as to turn on the channels of the transistors T1, T2. The voltage Vtg is, for example, Vcc (power supply voltage). The voltage Vts is, for example, Vcc (power supply voltage). The voltage Va1 is, for example, greater than or equal to the threshold voltage of the assist gate, for example, it is Vcc (power supply voltage) at the beginning and then is pulled up to about 8V after the transistors T1, T2 are turned off.

Then, a voltage Vp1 is applied to the selected control gate line CL3, a voltage Vp2 is applied to the selected select gate line SL3, a voltage Vp3 is applied to the selected bit line BL1, the voltage Vp1 is, for example, about 10V; the voltage Vp2 is greater than or equal to the threshold voltage of the select gate SG, the voltage Vp2 is, for example, about 1.5V; the voltage Vts is greater than the voltage Vp3, the voltage Vp3 is, for example, about 0V, to program the selected memory cell Q13 by using source side injection effect.

While performing the aforementioned programming operation, as to the other non-selected memory cells Q23, Q33, and Q43 which share the control gate line CL3, the select gate line SL3, and the assist gate line AL2 with the selected memory cell Q13, a voltage can be applied to the non-selected bit lines BL2, BL3, and BL4 respectively coupled to the non-selected memory cells Q23, Q33, and Q43 to prevent the non-selected memory cells Q23, Q33, and Q43 from being programmed. Besides, since the non-selected control gate lines CL1, CL2, and CL4 are not applied with a voltage, the other non-selected memory cells Q11~Q41, Q12~Q42, and Q14~Q44 won't be programmed.

Referring to FIG. 3 and FIG. 4B, while performing erasing operation, a voltage Ve1 is applied to the select gate lines SL1~SL4, and the substrate is floating so as to pull out and remove the electrons stored in the charge storage layers of all the memory cells Q11~Q41, Q12~Q42, Q13~Q43, and Q14~Q44 through the select gate, wherein the voltage difference between the select gate lines and the substrate may induce FN tunneling effect. The voltage Ve1 is, for example, about 11~V15V.

Referring to FIG. 3 and FIG. 4C, while performing reading operation, a voltage Vr1 is applied to the selected assist gate line AL2, a voltage Vr2 is applied to the selected control gate line CL3, a voltage Vr3 is applied to the selected select gate line SL3, a voltage Vr4 is applied to the selected bit line BL1 to read the memory cell Q13. Wherein, the voltage Vr1 is, for example, determined by the resistance of the substrate below the assist gate line, the voltage Vr1 is, for example, Vcc (power supply voltage). The voltage Vr2 is, for example, about 1.4V. The voltage Vr3 is greater than the threshold voltage of the select gate, for example, it is Vcc (power supply voltage). The voltage Vr4 is, for example, about 1.5V. The non-selected assist gate line AL1, the non-selected control gate lines CL1, CL2, CL4, the non-selected select gate lines SL1, SL2, SL4, the non-selected bit lines BL2, BL3, BL4 are not applied with a voltage or floating.

Under the bias condition described above, the digital information stored in the memory cell Q13 is determined by detecting the current in the channel of the memory cell Q13.

In the operation method of the present invention, a memory cell is programmed by using channel self-boosting through source side injection to pre-charge the channel of the assist gate to a predetermined voltage, so as to program the memory cell quickly. Besides, the memory cell is erased by using the select gate so that the electrons are removed through the select gate, so that the number of times of the electrons passing through the tunneling dielectric layer can be reduced, and the reliability of the device can be improved. Moreover, the charge storage layer has a corner at where adjacent to the select gate. While performing erasing operation, the electric field is concentrated by the corner, so that the speed of pulling the electrons from the charge storage layer to the select gate during erasing operation is increased.

Next, the manufacturing method of the non-volatile memory in the present invention will be described. FIGS. 5A~5G are cross-sectional views illustrating the manufacturing flow of a non-volatile memory according to an embodiment of the present invention.

First, referring to FIG. 5A, a substrate 200 is provided. The substrate 200 is, for example, a silicon substrate. A dielectric layer 202 is formed on the substrate 200. The material of the dielectric layer 202 is, for example, silicon oxide, and may be formed by, for example, a thermal oxidation process. Then, a charge storage layer 204 is formed on the dielectric layer 202.

The material of the charge storage layer 204 is, for example, conductive material (for example, doped polysilicon) or other charge-trapping material such as $Si_3N_4$, SiON, TaO, $SrTiO_3$, or HfO. If the material of the charge storage layer 204 is doped polysilicon, the charge storage layer 204 may be formed by, for example, performing chemical vapor deposition process to form an undoped polysilicon layer and then performing an ion implantation to implant ions into the undoped polysilicon layer, or the charge storage layer may be formed by performing a chemical vapor deposition process with in-situ dopant implantation. Besides, when the charge storage layer 204 is conductive material, it has, for example, a strip shape (not shown).

Next, an inter-gate dielectric layer 206 is formed on the substrate 200. The material of inter-gate dielectric layer 206 includes, for example, silicon oxide/silicon nitride/silicon oxide, and may be formed by, for example, forming a silicon oxide layer through a thermal oxidation process and then forming a silicon nitride layer and another silicon oxide layer in sequence through chemical vapor deposition process. Certainly, the material of the inter-gate dielectric layer 206 may also be silicon oxide or silicon nitride/silicon oxide etc.

Next, referring to FIG. 5B again, a conductive layer (not shown) and a cap layer (not shown) are formed on the inter-gate dielectric layer 206. Then, the cap layer, the conductive layer, and the inter-gate dielectric layer 206 are patterned to form a plurality of stacked layers 212 composed of the inter-gate dielectric layer 206a, the conductive layer 208, and the cap layer 210. The material of the conductive layer 208 is, for example, doped polysilicon, and may be formed by, for example, performing chemical vapor deposition process to form an undoped polysilicon layer and then performing an ion implantation to implant ions into the undoped polysilicon layer, or the conductive layer 208 may also be formed by using chemical vapor deposition with in-situ dopant implantation. The conductive layer 208 is used as, for example, the control gate. The material of the cap layer 210 is, for example, silicon nitride or silicon oxide, and the formation method thereof is, for example, chemical vapor deposition.

Figure 5C:
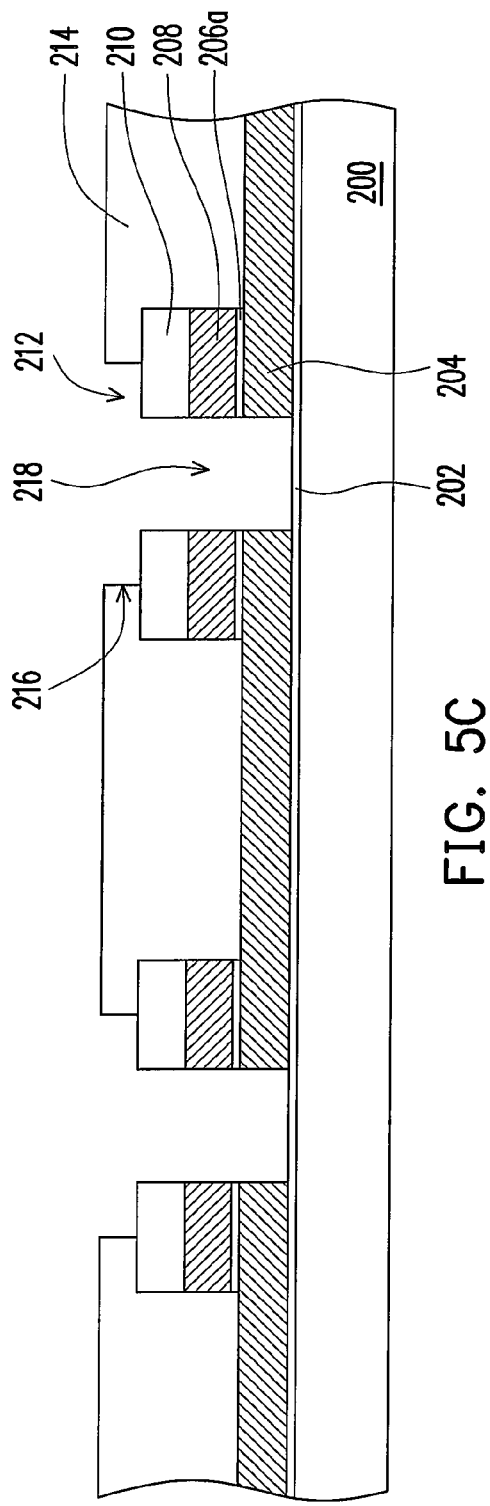

Next, referring to FIG. 5C, a patterned mask 214 is formed on the substrate 200. The patterned mask 214 has an opening 216 exposing the conductive layer 204 between every two stacked layers 212. Then, the conductive layer 204 between every two stacked layers 212 is removed by using the patterned mask 214 as a mask to form a trench 218. The trench 218 may be formed by, for example, performing an etching process to remove the conductive layer 204 between every two stacked layers 212 until the surface of the dielectric layer 202 is exposed. The material of the patterned mask 214 is, for example, photoresist layer, and the formation method of the patterned mask 214 is, for example, photolithography process.

Figure 5D:
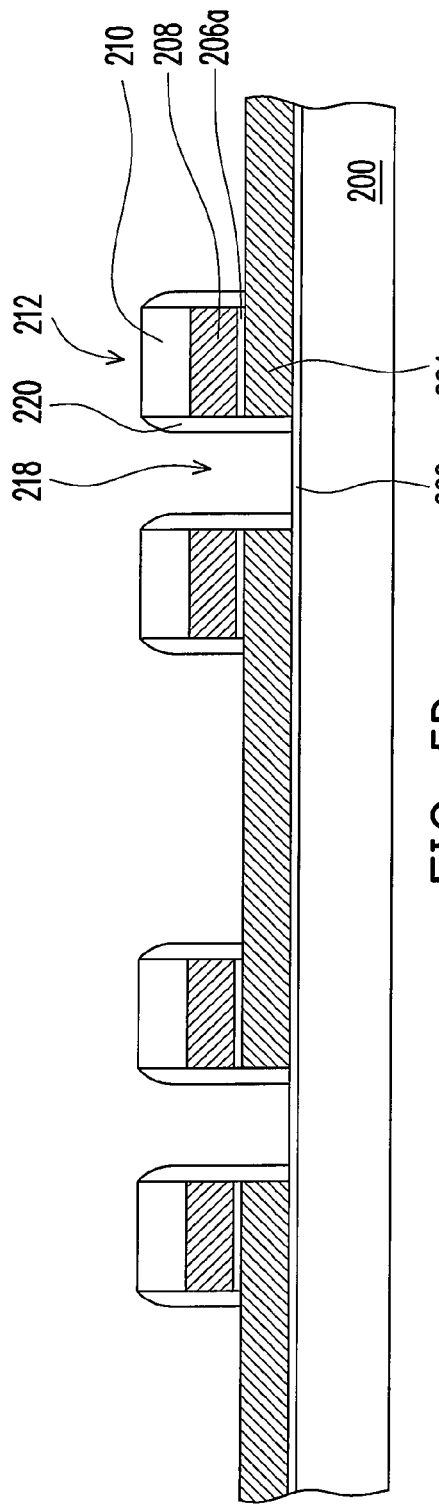

After that, referring to FIG. 5D, the patterned mask 214 is removed. The method for removing the patterned mask 214 includes, for example, removing most of the mask layer through plasma ashing process first and then performing wet cleaning process. Then, a spacer 220 is formed on the sidewall of the stacked layer 212 and the sidewall of the trench 218. The material of the spacer 220 is, for example, silicon nitride or other dielectric material. The spacer 220 may be formed by, for example, forming a spacer material layer to cover the entire substrate 200, and then performing anisotropic etching process to remove a portion of the spacer material layer.

Figure 5E:
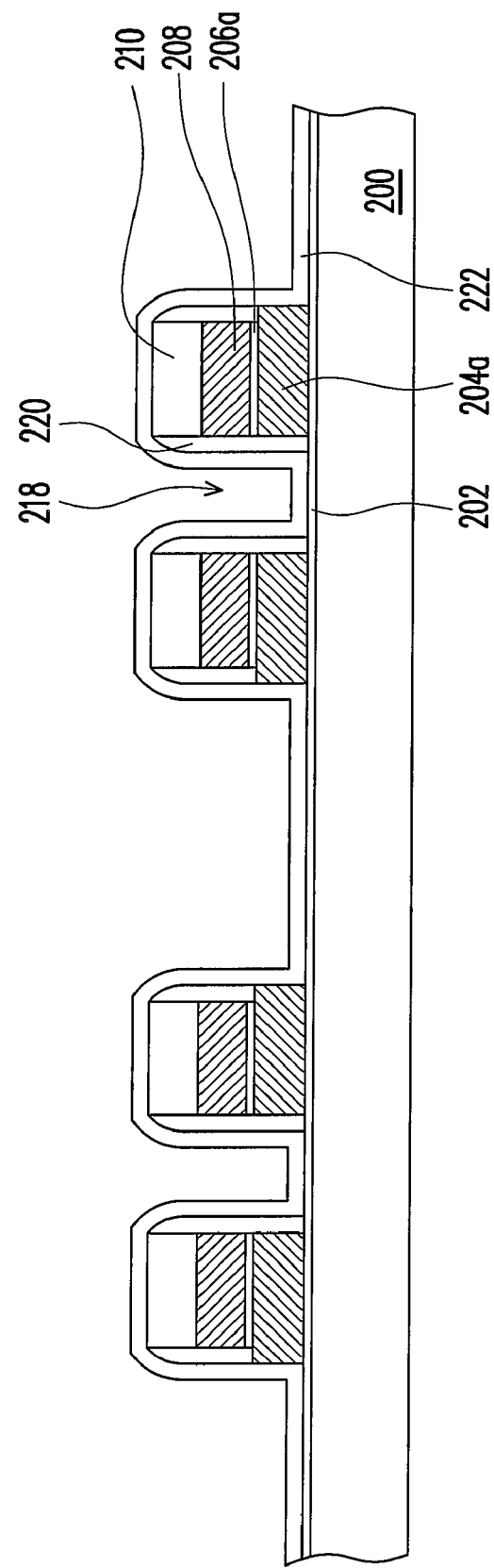

Next, referring to FIG. 5E, the exposed conductive layer 204 is removed by using the spacer 220, the stacked layers 212 as a mask to form a charge storage layer 204a below each stacked layer 212. Wherein the dielectric layer 202 between the charge storage layer 204a and the substrate 200 is used as, for example, the tunneling dielectric layer. Then, a conformal dielectric layer 220 is formed on the substrate 200. The material of the dielectric layer 222 is, for example, high temperature thermal oxide is layer, and may be formed by, for example, high temperature thermal oxidation.

Figure 5F:
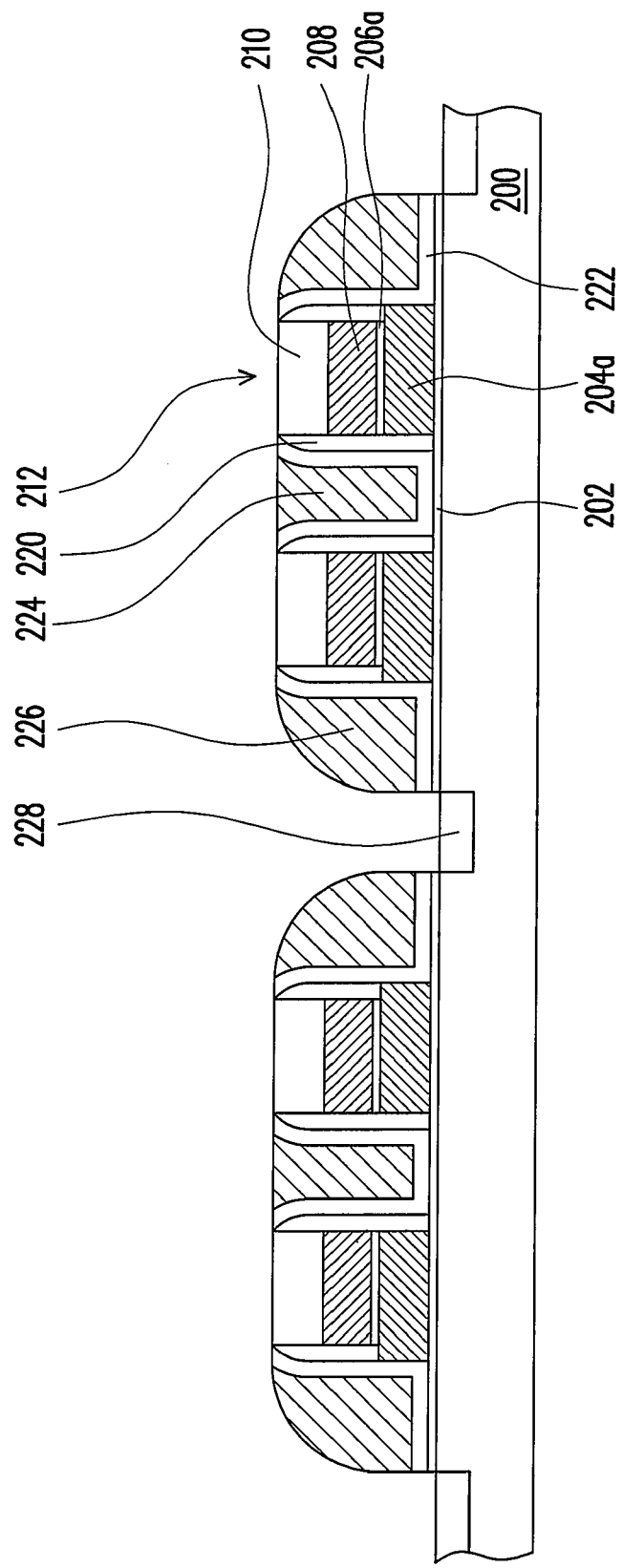

After that, referring to FIG. 5F, the conductive layer 224 is formed between the two stacked layers 212 and conductive layers 226 are respectively formed on the sidewall outside of the two stacked layers 212. The conductive layer 224 fills up the trench 218. The material of the conductive layer 224 and 226 is, for example, doped polysilicon, and may be formed by, for example, performing chemical vapor deposition process to form an undoped polysilicon layer and then performing an ion implantation to implant ions into the undoped polysilicon layer, or the conductive layers 224 and 226 may also be formed by using chemical vapor deposition with in-situ dopant implantation. A doped polysilicon layer is first formed on the substrate 200 through foregoing method first, then a portion of the doped polysilicon layer is removed by performing etch back process (anisotropic etching process) until the cap layer 210 is exposed, so as to form the conductive layers 224 and 226. The conductive layer 224 is used as, for example, assist gate. The dielectric layers 222 and 202 between the conductive layer 224 and the substrate 200 are used as, for example, assist gate dielectric layers. The dielectric layers 222 and 202 between the conductive layer 224 and the substrate 200 are used as, for example, assist gate dielectric layers. The conductive layer 226 is used as, for example, select gate. The dielectric layers 222 and 202 between the conductive layer 226 and the substrate 200 are used as, for example, select gate dielectric layers. Wherein the thickness of the dielectric layer 222 and 202 is, for example, about 100 angstrom (Å) to 200 angstrom (Å).

Then, a doped region 228 is respectively formed in the substrate 200 outside the two stacked layers 212. The doped region 228 is used as, for example, a drain region. The doped region 228 may be formed by, for example, performing an ion implantation process. Wherein the conductive layer 226 is, for example, formed on the substrate 200 between the doped region 228 and the conductive layer 208.

Figure 5G:
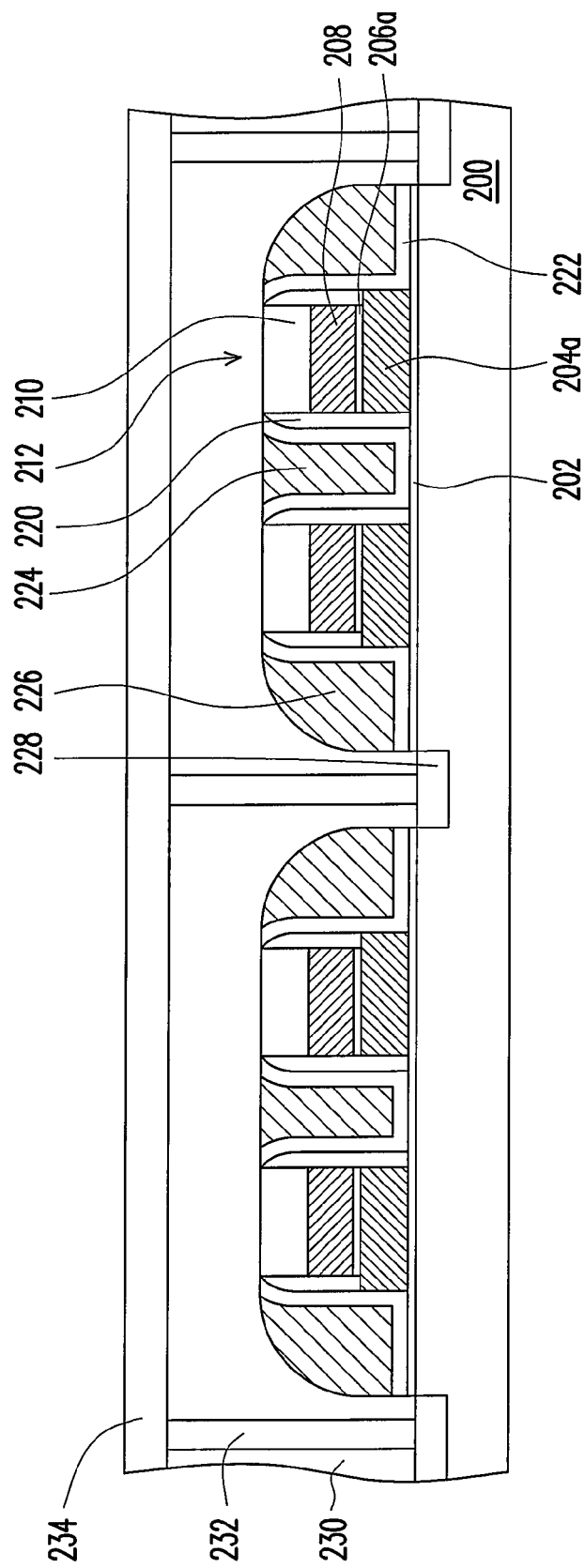

Next, referring to FIG. 5G, an inter-layer insulating layer 230 is formed on the substrate 200. The material of the inter-layer insulating layer 230 is, for example, silicon oxide, PSG, BPSG, or other suitable dielectric material, and the formation method thereof is, for example, chemical vapor deposition. Then, a plug 232 electrically connected to the doped region 228 is formed in the inter-layer insulating layer 230. The plug 232 may be formed by, for example, patterning the inter-layer insulating layer 230 to form an opening exposing the doped region 228, and then filling conductive material into the opening.

Next, a conductive layer 234 electrically connected to the plug 232 is formed on the inter-layer insulating layer 230. The conductive layer 234 is used as, for example, bit line. The subsequent process for manufacturing non-volatile memory is well-known to those skilled in the art therefore will not be described herein.

In the manufacturing method of non-volatile memory of the present invention, assist gate (the conductive layer 224) and the select gate (the conductive layer 226) are formed by using self-alignment method instead of photolithography process, thus, the manufacturing cost can be reduced and the process window can be increased.

Moreover, the charge storage layer 204a has a corner adjacent to the select gate (the conductive layer 226), thus, while erasing the memory cell, the electric field is concentrated by the corner, so that the speed of pulling the electrons from the charge storage layer 204a to the select gate (the conductive layer 226) during the erasing operation is increased.

In overview, according to the non-volatile memory of the present invention, two adjacent memory cells are, for example, disposed in mirror symmetry, that is, the two adjacent memory cells share the assist gate or the doped region, so that the integration of the device is increased.

Furthermore, when a voltage is applied to the assist gate to open up the channel below the assist gate and to form the inversion layer, a voltage is applied to the inversion layer so that the inversion layer below the assist gate can be in a pre-charged state. While programming the non-volatile memory in the present invention, the memory cell is programmed by using self-boosting through source side injection effect so as to increase the speed of programming. Moreover, when the non-volatile memory is used as a multi-level memory cell, the threshold voltage of the programmed memory cell can be accurately controlled to be in the predetermined range while performing programming operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-level non-volatile memory, comprising:
    a first memory cell disposed on a substrate, the first memory cell comprising:
        a control gate disposed on the substrate;
        a charge storage layer disposed between the control gate and the substrate;
        a doped region disposed in the substrate at a first side of the control gate;
        a select gate disposed on the sidewall of the first side of the control gate, and located on the substrate between the control gate and the doped region; and
        an assist gate disposed on the sidewall of a second side of the control gate, an inversion layer being formed in the substrate below the assist gate when a voltage being applied to the assist gate.

2. The multi-level non-volatile memory as claimed in claim 1 further comprising:
    a first dielectric layer disposed between the charge storage layer and the substrate;
    a second dielectric layer disposed between the charge storage layer and the control gate;
    a third dielectric layer disposed between the assist gate and the control gate, the charge storage layer, and between the assist gate and the substrate; and
    a fourth dielectric layer disposed between the select gate and the control gate, the charge storage layer, and between the select gate and the substrate.

3. The multi-level non-volatile memory as claimed in claim 2, wherein a spacer is formed between the third dielectric layer and the control gate, the charge storage layer.

4. The multi-level non-volatile memory as claimed in claim 2, wherein a spacer is formed between the fourth dielectric layer and the control gate.

5. The multi-level non-volatile memory as claimed in claim 2, wherein the material of the first dielectric layer comprises silicon oxide.

6. The multi-level non-volatile memory as claimed in claim 2, wherein the material of the second dielectric layer comprises silicon oxide/silicon nitride/silicon oxide.

7. The multi-level non-volatile memory as claimed in claim 2, wherein the third dielectric layer and the fourth dielectric layer are high temperature thermal oxide layers.

8. The multi-level non-volatile memory as claimed in claim 2, wherein a thickness of the third dielectric layer and the fourth dielectric layer is between 100 Å and 200 Å.

9. The multi-level non-volatile memory as claimed in claim 1, further comprising a second memory cell having a same structure as the first memory cell, the second memory cell and the first memory cell being disposed adjacently in mirror symmetry.

10. The multi-level non-volatile memory as claimed in claim 9, wherein the second memory cell is disposed at the first side of the first memory cell and shares the doped region with the first memory cell.

11. The multi-level non-volatile memory as claimed in claim 9, wherein the second memory cell is disposed at the second side of the first memory cell and shares the assist gate with the first memory cell.

12. The multi-level non-volatile memory as claimed in claim 1, further comprising a cap layer disposed on the control gate.

13. The multi-level non-volatile memory as claimed in claim 12, wherein the charge storage layer is protruded from the control gate horizontally and has a corner adjacent to the select gate.

14. A multi-level non-volatile memory, comprising:
    a plurality of memory cells disposed on a substrate in an array, each of the memory cells comprising:
        a control gate disposed on the substrate;
        a charge storage layer disposed between the control gate and the substrate;
        a doped region disposed in the substrate at a first side of the control gate;
        a select gate disposed on the sidewall of the first side of the control gate, located on the substrate between the control gate and the doped region; and
        an assist gate disposed on the sidewall of a second side of the control gate, wherein the memory cells in the same row are disposed adjacently in mirror symmetry;
    a plurality of bit lines arranged in parallel in the direction of a row, connecting the doped regions of the memory cells in the same row;
    a plurality of control gate lines arranged in parallel in the direction of a column, connecting the control gates of the memory cells in the same column;
    a plurality of select gate lines arranged in parallel in the direction of a column, connecting the select gates of the memory cells in the same column;
    a plurality of assist gate lines arranged in parallel in the direction of a column, connecting the assist gates of the memory cells in the same column; and
    a plurality of transistors disposed on the substrate, and the drains of the transistors being respectively connected to the substrate below the assist gate lines.

15. The multi-level non-volatile memory as claimed in claim 14 further comprising:
    a first dielectric layer disposed between the charge storage layer and the substrate;
    a second dielectric layer disposed between the charge storage layer and the control gate;
    a third dielectric layer disposed between the assist gate and the control gate, the charge storage layer, and between the assist gate and the substrate; and a fourth dielectric layer disposed between the select gate and the control gate, the charge storage layer, and between the select gate and the substrate.

16. The multi-level non-volatile memory as claimed in claim 15, wherein a spacer is formed between the third dielectric layer and the control gate, the charge storage layer.

17. The multi-level non-volatile memory as claimed in claim 15, wherein a spacer is formed between the fourth dielectric layer and the control gate.

18. The multi-level non-volatile memory as claimed in claim 15, wherein the material of the first dielectric layer comprises silicon oxide.

19. The multi-level non-volatile memory as claimed in claim 15, wherein the material of the second dielectric layer comprises silicon oxide/silicon nitride/silicon oxide.

20. The multi-level non-volatile memory as claimed in claim 15, wherein the third dielectric layer and the fourth dielectric layer are high temperature thermal oxide layers.

21. The multi-level non-volatile memory as claimed in claim 14, wherein the charge storage layer is protruded from the control gate horizontally and has a corner adjacent to the select gate.

22. The multi-level non-volatile memory as claimed in claim 14, wherein two adjacent memory cells disposed in mirror symmetry share the drain region.

23. The multi-level non-volatile memory as claimed in claim 14, wherein two adjacent memory cells disposed in mirror symmetry share the assist gate.

* * * * *